United States Patent [19]

LePage et al.

[11] 4,326,330
[45] Apr. 27, 1982

[54] PROCESS FOR PRODUCING A SELF-ALIGNED GRID FIELD-EFFECT TRANSISTOR

[75] Inventors: Joël LePage; Michel Laviron; Henri Derewonko, all of Paris, France

[73] Assignee: Thomson-CSF, Paris, France

[21] Appl. No.: 165,777

[22] Filed: Jul. 3, 1980

[30] Foreign Application Priority Data

Jul. 6, 1979 [FR] France ............... 79 17603

[51] Int. Cl.$^3$ ........................... H01L 21/28
[52] U.S. Cl. ..................... 29/571; 29/578; 29/591
[58] Field of Search .......... 29/571, 591, 578; 148/187

[56] References Cited

U.S. PATENT DOCUMENTS

| | | | |
|---|---|---|---|
| 3,858,304 | 1/1975 | Leedy et al. | 29/591 X |
| 3,912,546 | 10/1975 | Hunsperger et al. | 29/578 X |
| 3,994,758 | 11/1976 | Ogawa et al. | 29/591 X |
| 4,004,341 | 1/1977 | Tung | 29/578 X |
| 4,040,168 | 8/1977 | Huang | 29/578 X |
| 4,111,725 | 9/1978 | Cho et al. | 29/571 X |
| 4,173,063 | 11/1979 | Kniepkamp | 29/571 |
| 4,193,182 | 3/1980 | Lee | 29/571 |
| 4,213,840 | 7/1980 | Omori et al. | 29/591 X |
| 4,222,164 | 9/1980 | Trieborasser | 29/571 |
| 4,226,333 | 5/1981 | Reichert | 29/571 |

Primary Examiner—G. Ozaki
Attorney, Agent, or Firm—Oblon, Fisher, Spivak, McClelland & Maier

[57] ABSTRACT

A process allowing the position and the dimensions of the grid of a field-effect transistor as well as the gaps between source and grid, grid and drain to be fixed as early as the first masking operation. To this end, a mask is formed comprising source, grid and drain windows by using a first insulating or semi-insulating material then the three windows are filled by means of a second material. The ohmic source and drain contacts are deposited in the corresponding windows reopened by selective etching of the second material effected after masking the first part of the layer situated above the non-reopened window. Second selective etching after masking of the contacts allows a Schottky-type grid contact to be deposited.

5 Claims, 10 Drawing Figures

PROCESS FOR PRODUCING A SELF-ALIGNED GRID FIELD-EFFECT TRANSISTOR

BACKGROUND OF THE INVENTION

The invention relates to a process for producing a field-effect transistor in which the respective positions of the source, the gate and the drain are fixed at the stage of the first masking operation, which entails correct positioning of the masks used in the following operations. In such a case it is said that there is self-alignment of the gate.

A self-alignment process in known in which a layer of aluminum is deposited on the active semiconductor layer intended to receive the three conventional electrodes (source, gate and drain). On this aluminum deposit is deposited a layer of resin. It is on this resin that the first masking operation is carried out: it consists in opening two windows defining the respective location and size of the source and of the drain, and in leaving between the windows a cap of resin which determines approximately the location of the gate. The size of this gate, and its final position, are determined by prolonged etching of the aluminum until there is obtained, by sub-etching, a stub of aluminum covered by the resin cap.

This cap serves to protect the location of the grid during depositing of the source and drain contacts by metal evaporation.

The process is then impaired by inaccuracy in the location and the dimensions of the gate, especially when this latter is to be very fine, and very close to the source and the drain, as is necessary in very high frequencies. This accuracy is only partially improved by using X-rays in the masking operations. In fact, though the cap is then defined with greater precision, there still remains a lack of precision tied to the more or less difficult control of the chemical etching which follows the first masking operation.

SUMMARY OF THE INVENTION

The invention seeks to remedy this disadvantage. Furthermore, it enables the gate to be decentered while bringing it close to the source without risk of encroachment.

The process of the invention comprises at least the following steps:
  formation, on the active semiconductor layer of the transistor, of a mask formed by a first insulating or semi-insulating material comprising windows determining the dimensions and the final location of the source, of the gate and of the drain of the transistor to be produced;
  deposition of a layer of a second insulating material, selectively etchable by an agent which does not etch (or etches at a much lower rate) the first material;
  opening, by photo-etching carried out by menas of said agent, of source and drain windows laying bare the semiconductor;
  depositing ohmic source and drain contacts;
  opening, by photo-etching carried out by means of said agent, in the second material, of a window creating the initial gate window and laying bare therein the semiconductor; and
  depositing gate contact.

DESCRIPTION OF THE DRAWINGS

The invention will be better understood, and other characteristics will appear from the following description and accompanying drawings in which.

DESCRIPTION OF THE PREFERRED EMBODIMENT

Figure 1:
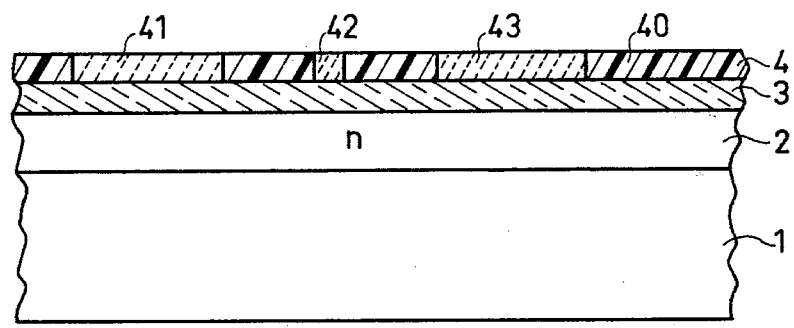
FIGS. 1 to 9 represent different stages of the process of the invention.

In FIG. 1 there is shown by way of example a fraction of a semi-insulating monocrystalline gallium arsenide substrate 1, on which there has been caused to grow, by epitaxy, an n-doped gallium arsenide layer 2 intended to play the role of active layer in a field-effect transistor.

The material of substrate 1 and of layer 2 could be formed by any other semiconductor material. With gallium arsenide, which lends itself better than silicon to the construction of high-frequency transistors, the invention provides certain advantages, in enabling a gate to be obtained with precision having very small dimensions and being suitably placed between source and drain, at very short distances therefrom. Semi-insulating aluminum and gallium arsenide may also be used, particularly $Ga_{0.65}Al_{0.35}As$.

On layer 2 there is deposited, by a conventional method, a thin layer 3 of a first insulating or semi-insulating material such as polycrystalline gallium arsenide. The use of such a material in the place of silica or silicon nitride, as is often practised in the gallium arsenide field-effect transistor technology, is advantageous because the polycrystalline gallium arsenide (which is semi-insulating in the absence of doping) presents a thermal expansion coefficient substantially equal to that of the monocrystalline arsenide of substrate 1 and layer 2. This characteristic is advantageous for it prevents the appearance of cracks or fractures in the semi-insulating layer when the transistor is subjected to sudden temperature variations, particularly in the case of high-power transistors. Of course, the first material could be formed by $SiO_2$ or $Si_3N_4$ while still remaining within the scope of the invention.

On layer 3, there has already been elaborated in the stage shown in FIG. 1 a resin mask 4 sensitive to short wavelength, ultraviolet or even X-ray radiation in the case where excellent resolution is desired.

In mask 4, shown before development of the resin, we find regions 41, 42 and 43 where the irradiated resin has become soluble in the developing agent, whereas the rest 40 of the mask is insoluble.

Figure 2:
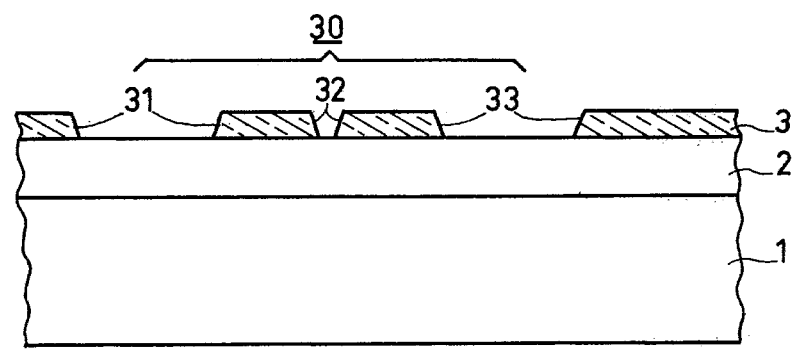

In FIG. 2 there has been shown the wafer of FIG. 1, after treatment, covered with a mask 30 comprising three windows 31, 32 and 33. This mask was obtained by developing the resin 3, then by etching the plate by means of an agent capable of eliminating the non-protected parts of the material of layer 3. The result obtained has been shown after elimination of the remainder 40 of resin 4. The etching is carried out either by ionic machining, or by chemical etching by means of an agent to which the resin is not very sensitive, or preferably by means of a localized plasma etching reactor using a gas chosen with respect to the material to be selectively etched.

In the following stage, FIG. 3, there is deposited a much thicker (of the order of half a micron if layer 3 is of the order of a tenth of a micron) layer 5 of a second material, which is also insulating or semi-insulating, being distinguished from the first by the possibility of selective etching. Gallium and aluminum arsenide may for example be used if the first material is pure gallium arsenide or conversely.

Figure 3:
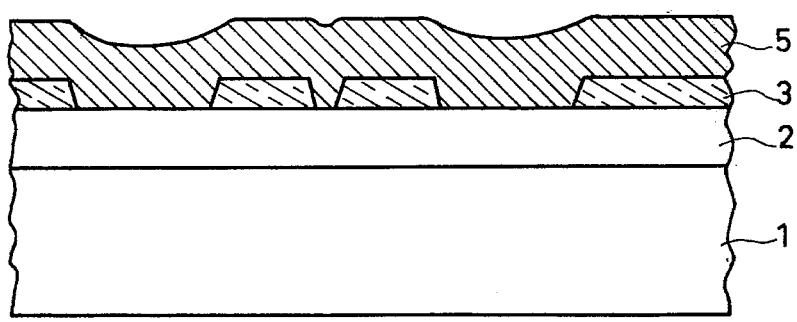
Figure 4:
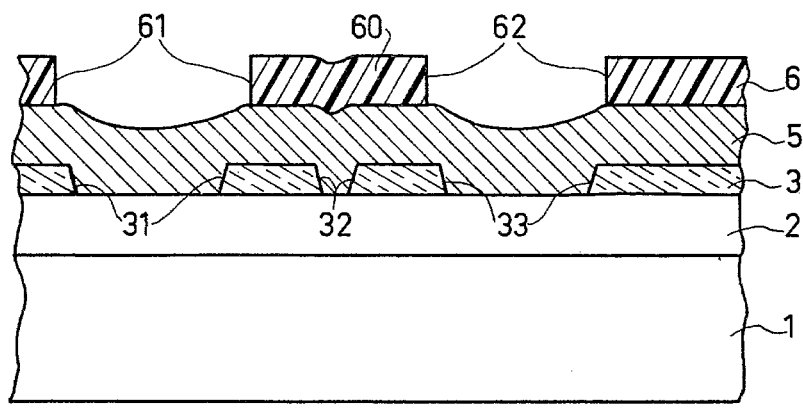

In FIG. 4 there is shown the wafer of FIG. 3 after elaboration of a resin mask 6 comprising two windows situated at the future source and drain locations, i.e., above the previous windows 31 and 33 of mask 30. It is not necessary to determine with great precision the location and the dimension of each opening for it is sufficient to make sure of the effective protection of the location of the previous window 32, by the resin stub 60 forming the central part of mask 6. In practice, a dimensional margin is adopted leading to having windows 61 and 62 slightly larger than windows 31 and 32. The resin used for forming mask 30 may be of the photosensitive type.

Figure 5:
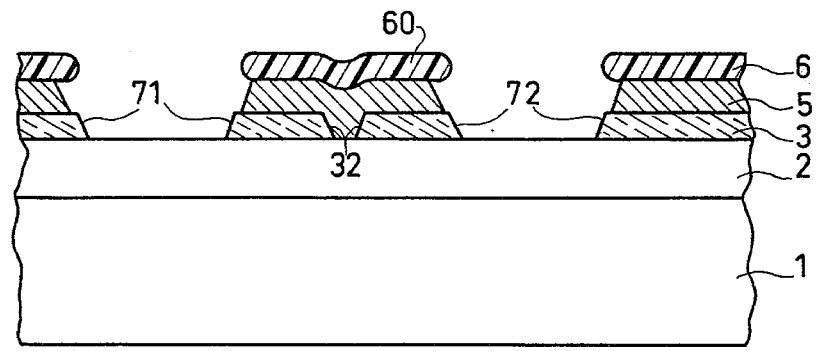

In FIG. 5 there is shown the result obtained after etching of the second material. This etching may be carried out either by using selective chemical agents or a localized plasma etching reactor. It produces windows 71 and 72 laying bare the material of layer 2.

Figure 6:
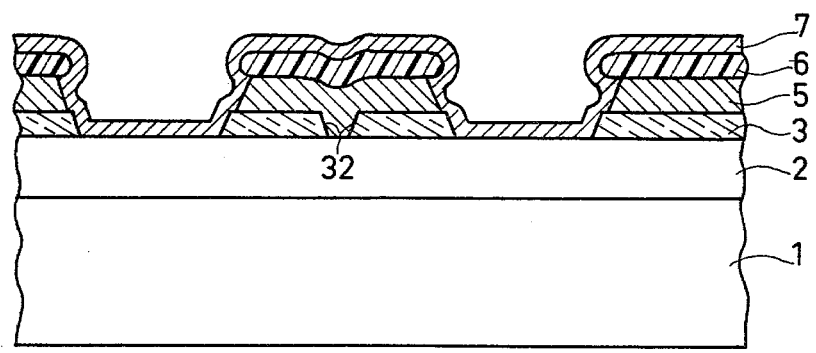

In FIG. 6 there is shown the wafer of FIG. 5 after deposition of a layer 7 obtained by vacuum metal evaporation over the whole of the wafer, resin 6 being left such as it was at the end of the preceding step.

Figure 7:
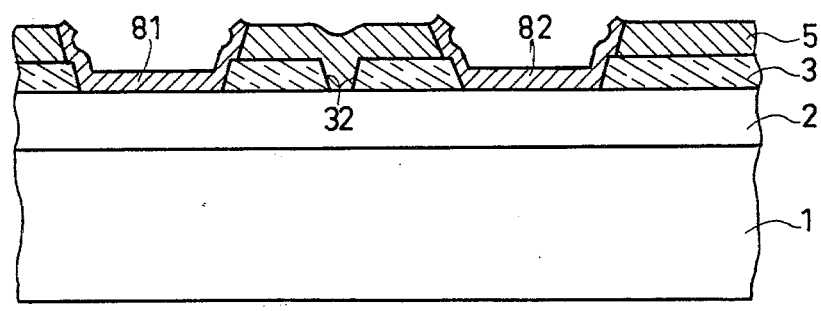

In FIG. 7 there is shown the wafer after development by means of a solvent which eliminates the resin 6 in accordance with the technology known as "lift-off". In such an operation, the part of the metal layer covering the resin is removed at the same time as the resin which served as a support therefor. The rest of the layer remains and forms the ohmic contacts 81 and 82.

Figure 8:
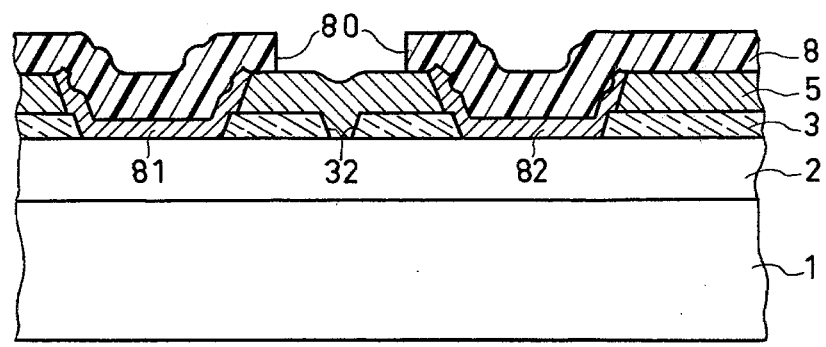

In FIG. 8 there is shown the wafer of FIG. 7 after formation of a photosensitive resin mask 8 comprising a window 80 situated at the location of the future grid, i.e., above the previous window 32 of the mask formed by the first insulating or semi-insulating material, this window being at present filled by the second material. The dimensions of window 80 are purposely larger than those of window 32.

Figure 9:
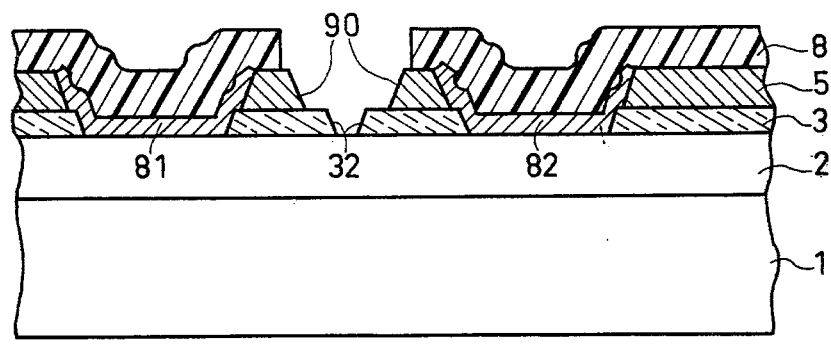

In FIG. 9 there is shown the wafer of FIG. 8 after etching of the second insulating or semi-insulating material, this etching being carried out in one of the ways already mentioned in connection with FIG. 5. The result is formed by the opening of a window 90 giving ample access to window 32 in which the material of layer 2 has been laid bare.

Figure 10:
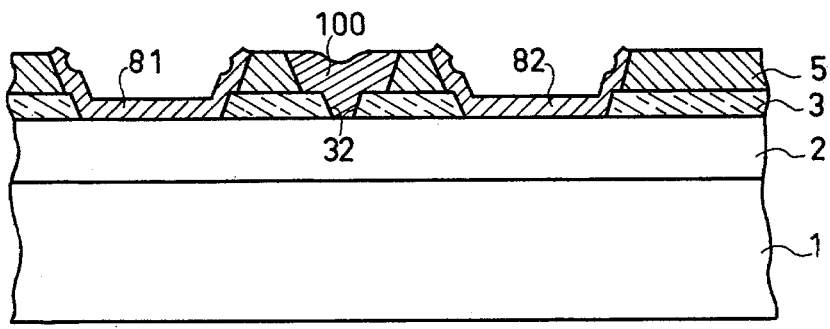
FIG. 10 shows a field-effect transistor constructed by the process of the invention.

In FIG. 10 there is shown the result obtained after deposition of a metal layer of which there remains only a stub 100 filling window 90. This deposition was carried out by vacuum metal evaporation followed by a lift-off operation laying bare the rest of the wafer, particularly the region of the source and drain contacts 81 and 82. Stub 100 forms the grid contact, of the Schottky type.

The structure of FIG. 10 constitutes that of a field-effect transistor whose passivation layer comprises two different materials. Thus there is obtained a component practically ready for use. In the case of collective manufacture of a large number of identical transistors on the same wafer (only one of them has been shown in FIGS. 1 to 10), separation of the components must however be carried out by a mechanical or chemical method or a combination of these two types of methods, in a conventional way.

Besides the advantage already mentioned relative to the self-alignment of the gate and to the precision which results therefrom particularly insofar as the intentional decentering of the gate in the source-drain gap is concerned, the following should be noted:

the form of the metal "stub" forming the gate contact, facilitating the coupling up of the gate connection of the field-effect transistor;

the good protection of the active layer provided by the two successive layers of insulating or semi-insulating material, this protection being achieved immediately after formation of layer 2;

the possibility of choosing, for the first material, a semi-insulating material having a resistivity facilitating the removal of the imprisoned charges from the passivation layer and forming an undesirable source of spurious noise, and the possibility of applying the process of the invention to high-power transistors.

What is claimed is:

1. A process for producing a self-aligned grid field-effect transistor, comprising at least the following steps:

formation, on the active semiconductor layer of the transistor, of a mask formed by a first insulating or semi-insulating material comprising windows defining the dimensions and the final location of the source, the gate and the drain of the transistor to be produced;

deposition of a layer of a second insulating material, selectively etchable by an agent which does not etch (or etches at a much slower rate) the first material;

opening, by photo-etching effected by means of said agent, of source and drain windows laying bare the semiconductor;

deposition of ohmic source and drain contacts;

opening, by photo-etching carried out by means of said agent, in the second material, of a window creating the initial gate window and laying bare therein the semiconductor; and deposition of a gate contact.

2. A process as claimed in claim 1, wherein the following steps are included:

(a) Irradiation, through a mask, of a resin layer sensitive to short wavelength radiation deposited on a semiconductor wafer comprising a semi-insulating substrate, the active semiconductor layer and a first passivation layer formed by the first material;

(b) Development of the resin layer, and elimination of the first material in the parts of the first passivation layer which are not protected by the resin;

(c) Deposition of a second passivation layer formed by the second material;

(d) Elaboration of a photosensitive resin mask comprising windows at the locations of the future source and drain;

(e) Opening of the source and drain windows;

(f) Deposition of a metallic layer by evaporation of a metal on the wafer in the state in which it finds itself on leaving step (e);

(g) Removal by lift-off of the metal layer deposited in the preceding step, leaving existing only the source and drain contacts;

(h) Elaboration of a photosensitive resin mask comprising, at the location of the future grid, an opening larger than the future grid;

(i) Elimination of the second material in the opening obtained in the preceding step to open the gate window;

(j) Deposition of a metal layer by evaporation of a metal on the wafer in the state in which it finds itself on leaving step (i); and (k) Removal by lift-off of the metal layer deposited in the preceding step, leaving existing only the gate contact.

3. A process as claimed in claim 1, wherein the active semiconductor layer is formed by monocrystalline gallium arsenide.

4. A process as claimed in claim 1 wherein the first insulating or semi-insulating material is polycrystalline gallium arsenide, the second material being aluminum and gallium arsenide.

5. A process as claimed in claim 1 wherein the first insulating or semi-insulating material is aluminum and gallium arsenide, the second material being polycrystalline gallium arsenide.

* * * * *